(12) United States Patent
Wang et al.

(10) Patent No.: US 8,274,839 B2
(45) Date of Patent: Sep. 25, 2012

(54) METHOD OF ERASING A FLASH EEPROM MEMORY

(75) Inventors: Lee Z. Wang, Hsinchu (TW); Jui-Hung Huang, Hsinchu (TW)

(73) Assignee: FS Semiconductor Corp., Ltd., Hsinchu (TW)

( * ) Notice: Subject to any disclaimer, the term of this patent is extended or adjusted under 35 U.S.C. 154(b) by 121 days.

(21) Appl. No.: 13/006,847

(22) Filed: Jan. 14, 2011

(65) Prior Publication Data

US 2012/0182811 A1 Jul. 19, 2012

(51) Int. Cl.
*G11C 11/34* (2006.01)
*G11C 16/04* (2006.01)

(52) U.S. Cl. .................. 365/185.29; 365/185.3

(58) Field of Classification Search ........... 365/185.02, 365/185.09, 185.29, 185, 185.19
See application file for complete search history.

(56) References Cited

U.S. PATENT DOCUMENTS

| | | | |
|---|---|---|---|
| 4,698,787 A | 10/1987 | Mukherjee et al. | |
| 5,077,691 A | 12/1991 | Haddad et al. | |
| 5,243,559 A | 9/1993 | Murai | |
| 5,361,235 A | 11/1994 | Kodama | |
| 5,457,652 A | 10/1995 | Brahmbhatt | |
| 5,790,460 A | 8/1998 | Chen et al. | |
| 6,614,693 B1* | 9/2003 | Lee et al. | 365/185.29 |
| 6,856,552 B2* | 2/2005 | Takahashi | 365/185.29 |
| 7,796,443 B2 | 9/2010 | Berco | |
| 2007/0036001 A1* | 2/2007 | Kanda et al. | 365/185.18 |

* cited by examiner

*Primary Examiner* — VanThu Nguyen
(74) *Attorney, Agent, or Firm* — Muncy, Geissler, Olds & Lowe, PLLC

(57) ABSTRACT

A method for erasing a flash EEPROM memory device is disclosed. The memory device has a first semiconductor region of one conductivity type formed within a second semiconductor region of an opposite conductivity type, source and drain regions formed from a semiconductor layer of the opposite conductivity type in the first semiconductor region, a well electrode formed from a semiconductor layer of the conductivity type inside the first semiconductor region, a charge storing layer electrically isolated from the first semiconductor region by a dielectric layer and having electric charge retention properties, and a control gate electrode electrically isolated from the charge storing layer by a inter layer of coupling dielectrics. The method comprises the steps of: applying a first voltage bias to both the well electrode and the second semiconductor region and a second bias to the control gate electrode for a duration of F/N tunneling; applying a third voltage bias to the well electrode and the second semiconductor region and a first zero voltage bias to the control gate electrode for a duration of traps depopulation; and, after the duration of traps depopulation, applying a fourth voltage bias to the control gate electrode and a second zero voltage bias to the well electrode and the second semiconductor region for a duration of traps assisted tunneling.

17 Claims, 6 Drawing Sheets

METHOD OF ERASING A FLASH EEPROM MEMORY

CROSS REFERENCE TO RELATED APPLICATIONS

This application is related to U.S. Pat. No. 7,796,443 by Danny Berco, assigned to FS Semiconductor Corp., Ltd. and incorporated herein by reference in its entirety.

BACKGROUND OF THE INVENTION

1. Field of the Invention

This invention relates to the operation of a non-volatile flash memory cell and in particular, to erasing the cell by manipulating the stored charges within.

2. Description of the Related Art

U.S. Pat. No. 7,796,443 (by Danny Berco) presents that a flash Electrical Erasable Programmable Read Only Memory (EEPROM) can be erased by means of applying two time-separated voltage pulses to the semiconductor substrate and the control gate, respectively. The two-time-separated-voltage-pulse sequence in Berco has good reliability over the Negative Gate Source Erase (NGSE) sequence and faster erase speed than the conventional channel Fowler-Nordheim (F/N) tunneling. Although the conventional channel F/N tunneling method has no hot-hole injection resulting in hole-related damages in the tunneling dielectric (silicon dioxide), the tunneling process requires a long time to tunnel out the stored electrical charges (electrons or holes) from the storing material. The durations for the conventional F/N tunneling pulses are in the range of from sub-milliseconds to hundreds of milliseconds. Typically, the time required to erase a flash array to a desired threshold-voltage range using F/N tunneling can be as long as seconds depending on the applied tunneling electrical field strength (voltages across the tunneling dielectric divided by the dielectric thickness), and the properties of the storing material. The storing material can be poly-silicon; trap based dielectric film like nitride, or nanocrystals. The nitride film as charge trap material usually takes much longer time than those using poly-silicon as the storing material.

We have observed that the erase efficiency using F/N tunneling becomes very poor when the cells' threshold voltages are erased to their intrinsic threshold voltages, where the storing material stores almost zero net charges (the net charges of electrons and holes under the control gate in the channel regions). We attribute the phenomena to the interaction between the tunneling current and tunneling dielectric traps, specially the interfacial traps. In fact, the slow erase/ programming behaviors of the slow-bit cells or stressed cells with higher trap density in the cell tunneling dielectric also exhibits the similar interaction. In contrast, the fast erase/ programming bit cells have less trap density in the tunneling dielectric.

On the other hand, the fast erase method in Berco exhibits very large threshold voltage down-shift per erasing pulse with pulse durations of hundreds of micoseconds in contrast to the pulse durations of from several hundreds to tens of milliseconds for F/N tunneling. The pulse durations in Berco are several hundreds times shorter than those in the conventional F/N tunneling erase. Therefore, the erase speeds using the disclosed method in Berco are about two orders of magnitudes faster than the conventional F/N tunneling erase. Despite the shorter erase pulsesin Berco, we have learned that the erase method in Berco accumulates more electrons in the tunneling dielectric after numbers of program/erase cycling in comparison with conventional F/N tunneling erase. The accumulation of electrons in the tunneling dielectric reduces the erase efficiency resulting in more numbers of erase pulse shots to obtain the desired erased threshold voltages for the cycled flash cells in spite of the hundred times shorter pulse duration.

To minimize the effects of electron accumulation in the tunneling dielectric in the disclosed method of Berco and to enhance the erase efficiency for F/N tunneling near the intrinsic cell threshold voltages, we have applied a new erase sequence to incorporate both F/N tunneling pulses and the two time-separated pulses in the present invention. The new erase sequence exhibits very high erase efficiency and less electron accumulation for both fresh and program/erase cycled flash cells.

SUMMARY OF THE INVENTION

A flash memory device having a first semiconductor region of one conductivity type formed within a second semiconductor region of an opposite conductivity type, source and drain regions formed from a semiconductor layer of the opposite conductivity type in the first semiconductor region, a well electrode formed from a semiconductor layer of the conductivity type inside the first semiconductor region, a charge storing layer electrically isolated from the first semiconductor region by a dielectric layer and having electric charge retention properties, and a control electrode electrically isolated from the charge storing layer by a inter-layer of coupling dielectrics. Cross section views and the correspondent electrodes of a typical N-type and a typical P-type non-volatile semiconductor memories are shown in FIG. 1 and FIG. 2, respectively.

According to an embodiment of the invention, an erase method that replaces electrons with holes comprises the following steps of:

(1) Simultaneously applying a first voltage bias of positive polarity to both the well electrode and the second semiconductor region and a second voltage bias of negative polarity to the control gate with the source and drain regions either kept floating or at the same voltage as the well electrode for an interval of a couple of milliseconds.

(2) Applying a third voltage bias of positive polarity to the well electrode and the second semiconductor region with the source and drain regions either kept floating or at the same voltage as the well electrode while keeping the control gate voltage bias at zero for an interval of microseconds.

(3) After applying the third voltage bias to the well electrode, applying a fourth voltage bias of negative polarity to the control gate for an interval of hundreds of microseconds.

F/N tunneling occurs in step 1 to have the stored charges tunneling out of the storing material. Thereby, after charges (electrons) stored in the charge storing layer are removed by means of F/N tunneling through the tunneling dielectric into the well electrode and source and drain regions by the first half of the erase sequence (step 1), the second half of the erase sequence (steps 2 and 3, hereinafter referred to as Trap Assisted Channel Erase (TACE)) enhances the process from one stored charge polarity (electrons) to the other stored charge polarity (holes) in the charge storing layer.

According to an embodiment of the invention, an erase method that replace sholes with electrons comprises the following steps of:

(1) Applying a first voltage bias of negative polarity to the well electrode and the second semiconductor region with the source and drain regions either kept floating or at the same voltage as the well electrode for an interval of microseconds, while keeping the control gate voltage bias at zero.

(2) After applying the first voltage bias, applying a second voltage bias of positive polarity to the control gate for an interval of hundreds of microseconds.

(3) Simultaneously applying a third voltage bias of positive polarity to the control gate and a fourth bias of negative polarity to the well electrode and the second semiconductor regions with the source and drain regions either kept floating or at the same voltage as the well electrode for an interval of a couple of milliseconds.

The F/N tunneling in step 3 has electrons tunnel into the charge storing layer.

Thereby, after one stored charge polarity (holes) is exchanged for the other stored charge polarity (electrons) in the charge storing layer in the first half of the erase sequence (step 1 and 2, TACE), the F/N tunneling process tunnels more electrons into the charge storing layer (step 3).

The erase method of the present invention introduces an innovative approach by the applications of F/N tunneling for removing or adding the stored charges and of Trap Assisted Channel Erase (TACE) for exchanging the stored charge polarity in the charge storing layer. By applying a positive voltage to the well electrode during the first stage in TACE, the interface traps near the silicon substrate would be forced to deplete the charge population. For instance, the electrons occupying the interface traps near the silicon substrate are depleted by applying the positive voltage. During the following stage in TACE, the control gate is inversely biased, charges are tunneled between the unoccupied interface traps and the charge storing layer. We have observed that the enhancement of this charge exchanging process disappears when the time interval between two separated voltage pluses (i.e. TACE) are greater than several hundreds of microseconds. The phenomenon indicates that the interface traps with relaxation time of the orders of hundred microseconds involve in this charge exchanging process.

DETAILED DESCRIPTION OF THE INVENTION

The following detailed description is meant to be illustrative only and not limiting. It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items.

Figure 1:
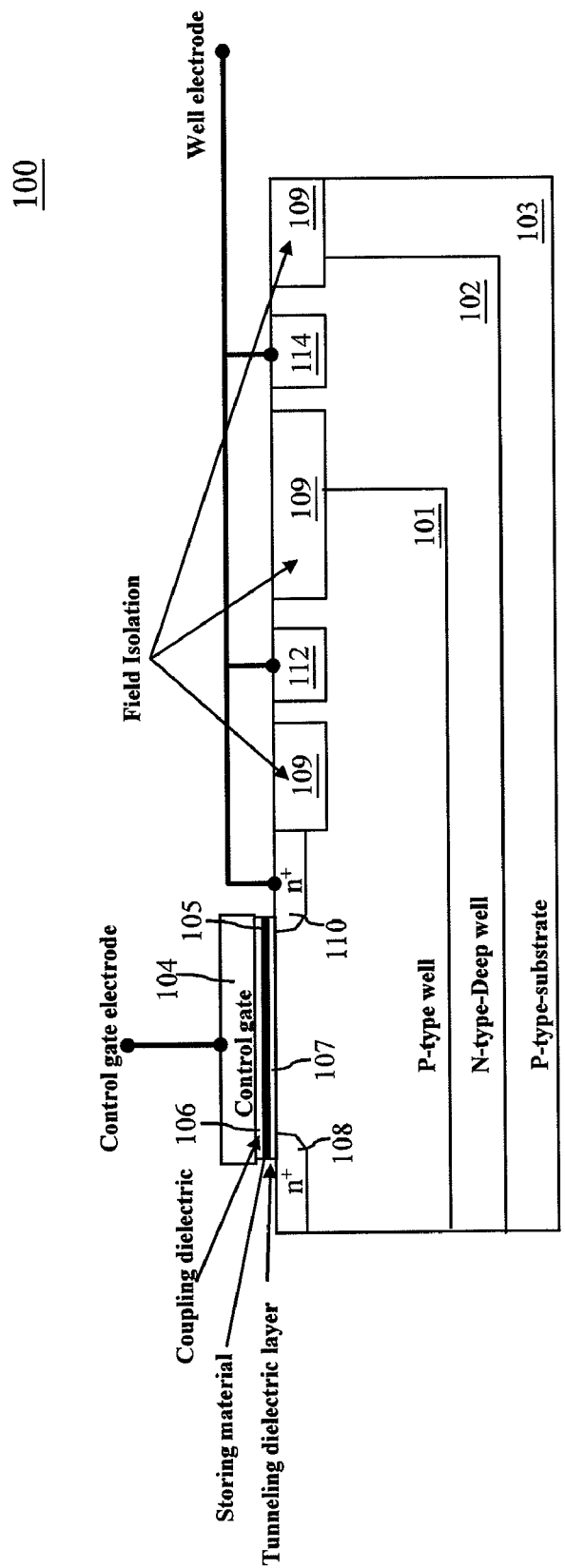
FIG. 1 shows a cross section view of a typical N-type non-volatile semiconductor memory cell and its electrodes for applying voltage biases in erase sequence.

FIG. 1 shows a cross section view of an n-type non-volatile semiconductor memory and the correspondent electrodes applied in this invention. The non-volatile memory device 100 is formed in a p-type triple well 101, formed within an n-type deep well 102, formed in a p-type substrate 103. The device 100 has a control gate 104 that is formed above a storing material 105 (also referred to as charge storing layer) with an inter-layer coupling dielectric 106 sandwiched therebetween. The storing material 105 can be a poly-silicon floating gate; trap based dielectric film like nitride, or nano-crystals. The storing material 105 is isolated from the channel area by a tunneling dielectric layer 107. The drain 108 is formed from an n-type semiconductor as the source 110. The triple p-well 101 is contacted using highly doped p-type region 112 and the deep n-well 102 is contacted using highly doped n-type region 114. Field isolation areas 109 electrically separate memory devices and the contact areas for various types of wells and p-substrate.

Figure 2:
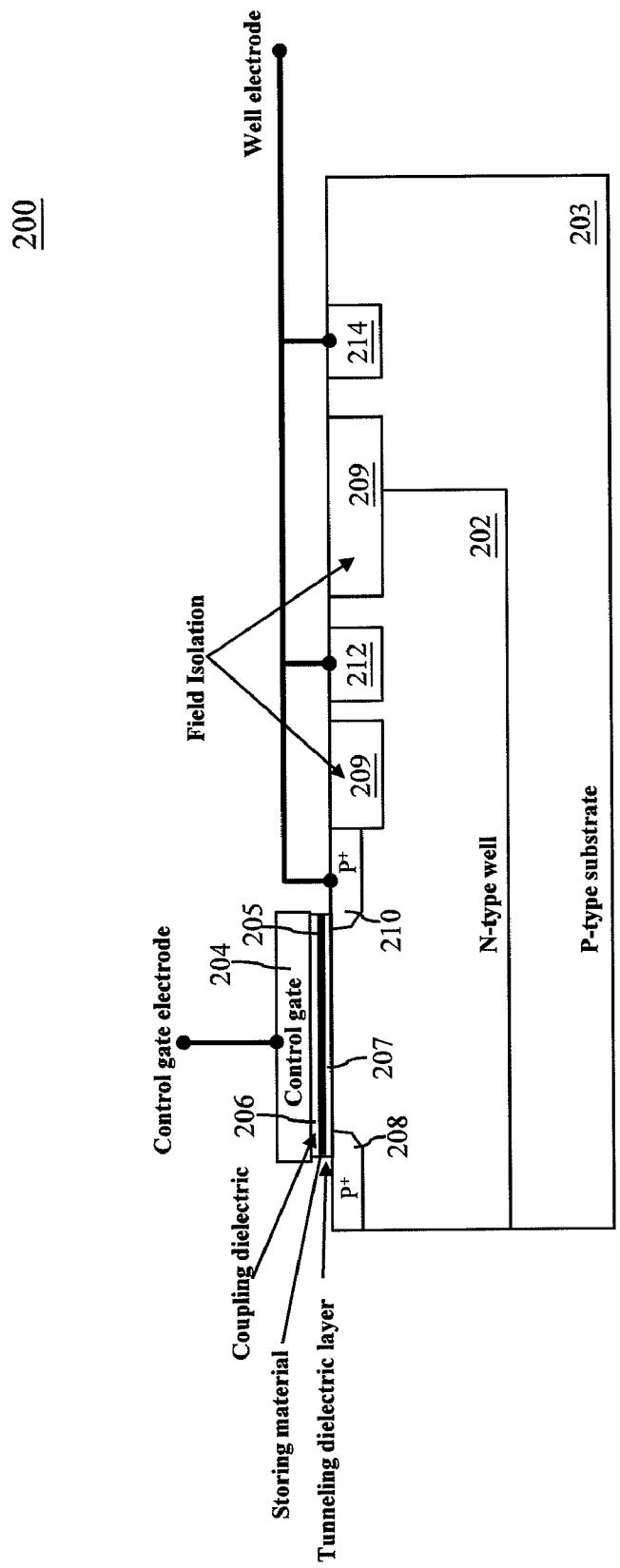
FIG. 2 shows a cross section view of a typical P-type non-volatile semiconductor memory cell and its electrodes for applying voltage bias in erase sequence.

FIG. 2 shows a cross section view of a P-type non-volatile semiconductor memory and the correspondent electrodes applied in this invention. The non-volatile memory device 200 is formed in an n-type well 202, inside a p-type substrate 203. The device 200 has a control gate 204 that is formed above a storing material 205 with an inter-layer coupling dielectric 206 sandwiched therebetween. The storing material 205 can be a poly-silicon floating gate; trap based dielectric film like nitride, or nano-crystals. The storing material 205 is isolated from the channel area by a tunneling dielectric layer 207. The drain 208 is formed from a p-type semiconductor as the source 210. The n-well 202 is contacted using highly doped n-type region 212 and the p-type substrate 203 is contacted using highly doped P-type region 214. Field isolation areas 209 electrically separate memory devices and the contact areas for n-well 202 and p-substrate 203.

Figure 3:
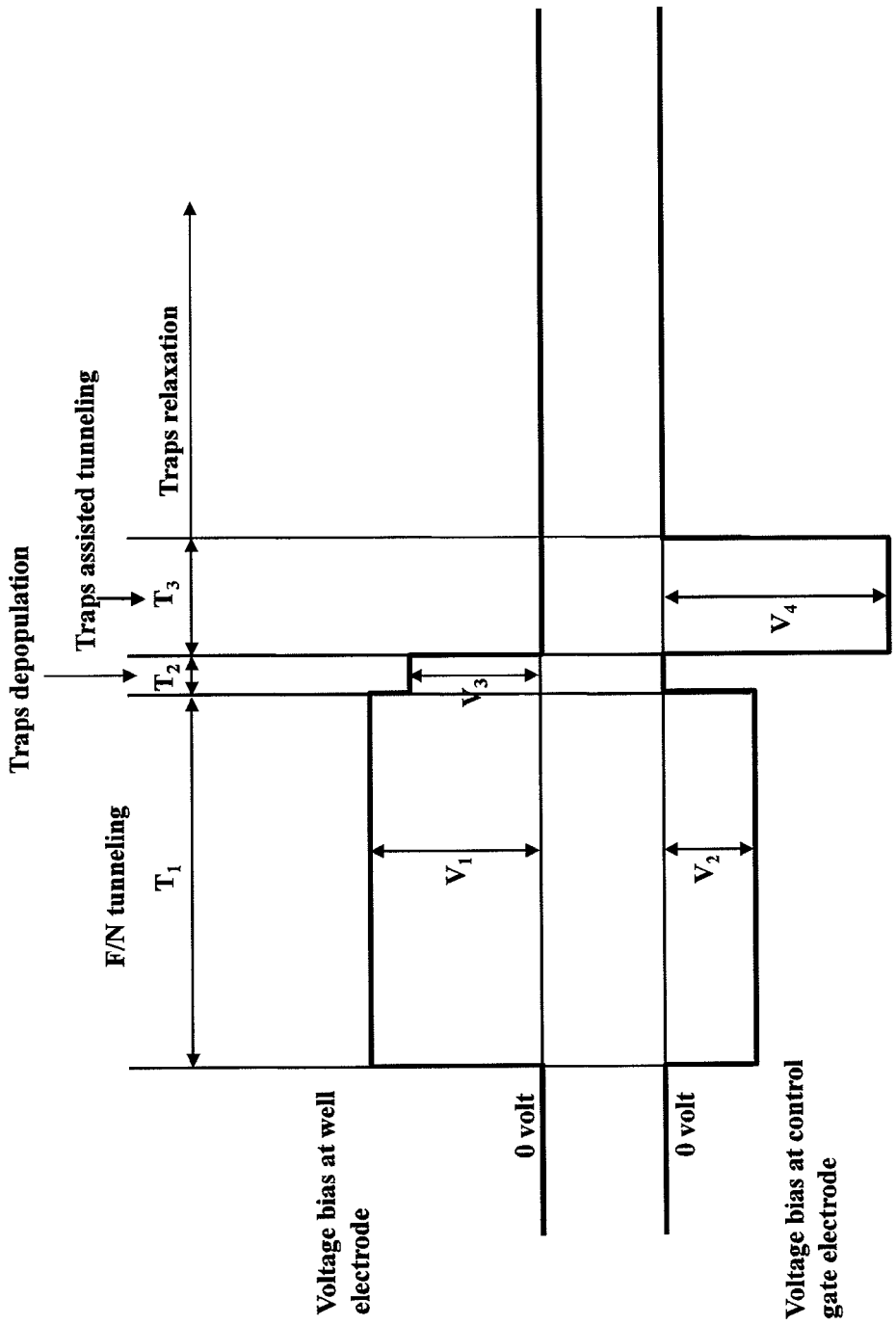
FIG. 3 depicts one embodiment of the invented erase sequence to change a storing material from electron-storing state to hole-storing state for both N-type and P-type non-volatile semiconductor memory cells and their bias voltage waveform timing alignment.

In an embodiment of the present invention where the storing material is changed from an electron-storing state to a hole-storing state, erasing the flash cell for each of the N-type and P-type non-volatile semiconductor devices depicted in FIG. 1 and FIG. 2, respectively, is accomplished by biasing the well and gate electrodes as described in FIG. 3. The well voltage bias is of a positive polarity and the gate voltage bias is of a negative polarity. At F/N tunneling stage, the electrical filed strength generated from the voltage bias difference ($V_1 - V_2$) between the simultaneously applied well voltage bias ($V_1$) and control gate voltage bias ($V_2$) is strong enough to cause the F/N tunneling through the tunneling dielectric for time intervals $T_1$ of several milliseconds. The typical applied voltage difference for F/N tunneling is in the range of tens of volts. During the F/N tunneling process, the electrons with higher energy state tunnels out of the storing material 105. It is noted that the well voltage bias shown in FIGS. 3 and 4 is simultaneously applied to the well electrode 112 and the the deep n-well 102 (via the highly doped n-type region 114), whereas each of the source 110 and the drain 108 may be floating or at the same voltage as the well electrode 112.

After the F/N tunneling process, the voltage bias to the control gate 104 is switched to zero and the well voltage bias is switched to a third positive voltage $V_3$ such that the electrical field generated by the voltage difference $V_3$ is insufficient to cause F/N tunneling between the storing material 105 and device substrate 103. Meanwhile, the application of the voltage bias $V_3$ to the well de-populates the electrons in the traps near the channel interface. The trap depopulation process is fast and continues for the time intervals $T_2$ less than microseconds. During the third time interval $T_3$ of about hundreds of microseconds, the voltage bias to the well is switched to zero and a fourth voltage $V_4$ of negative polarity is applied to the control gate 104. In FIGS. 3 and 4, the time interval $T_3$ is defined as a duration of traps assisted tunneling. During this time interval $T_3$, charges tunnel between the storing material 105 and the interfacial traps. After the applied voltage biases are switched off, the excessive electrons in the taps relax to an equilibrium state. The net charge state in the storing material 105 is changed from an electron-storing state to a hole-storing state.

Figure 4:
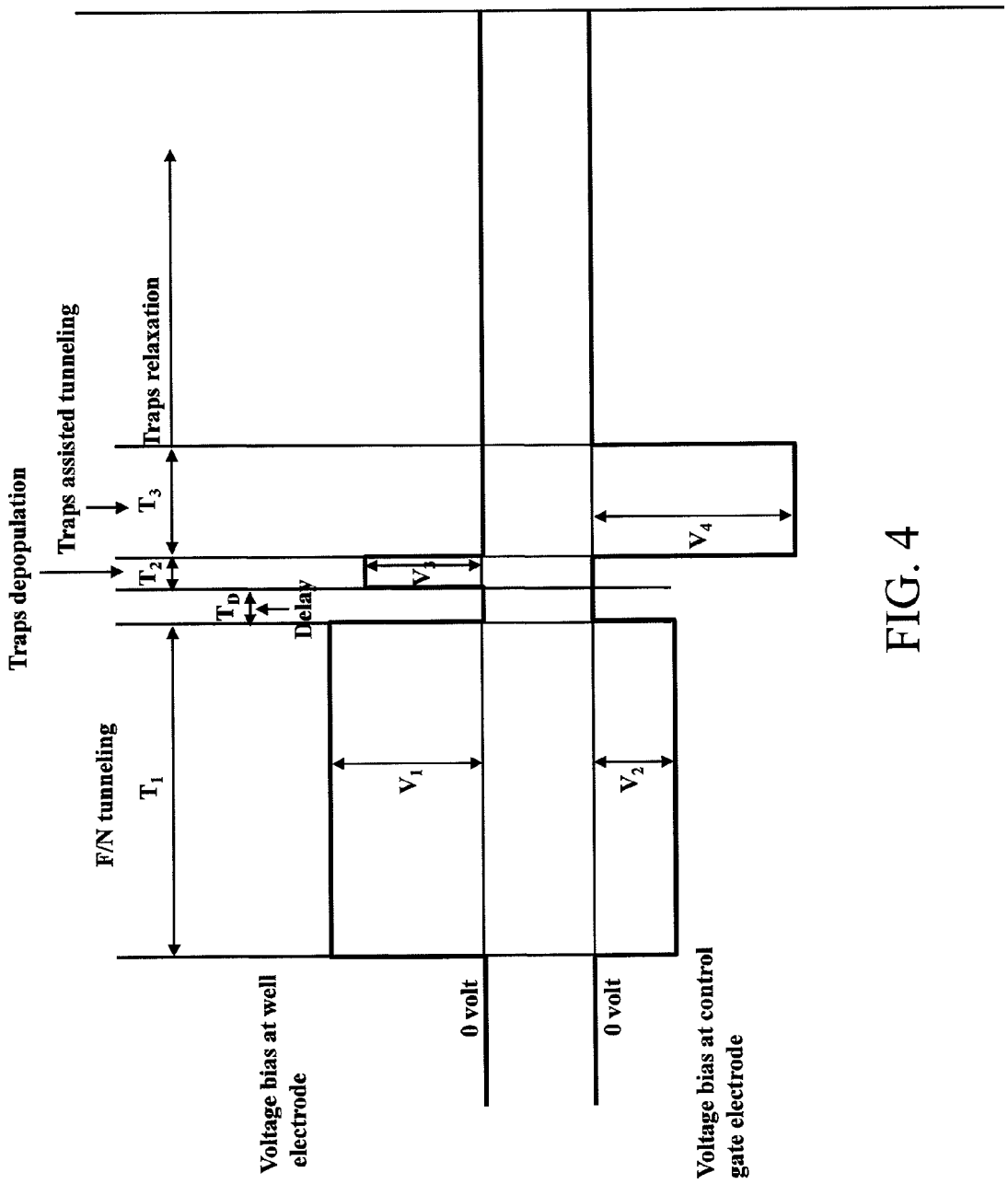
FIG. 4 depicts one embodiment of the invented erase sequence to change the storing material from electron-storing state to hole-storing state for both N-type and P-type non-volatile semiconductor memory cells and their bias voltage waveform timing alignment.

In another embodiment of the present invention where the storing material is changed from an electron-storing state to a hole-storing state, erasing the flash cell for each of the N-type and P-type non-volatile semiconductor devices depicted in FIG. 1 and FIG. 2, respectively, is accomplished by biasing the well and gate electrodes as described in FIG. 4. The well voltage bias is of a positive polarity and the control gate voltage bias is of a negative polarity. The electrical filed strength generated from the voltage bias difference $(V_1-V_2)$ between the simultaneously applied well voltage bias $(V_1)$ and control gate voltage bias $(V_2)$ is strong enough to cause the F/N tunneling through the tunneling dielectric for the time intervals $T_1$ of several milliseconds. The typical applied voltage difference between the two electrodes is in the range of tens of volts for a typical non-volatile semiconductor memory. During the F/N tunneling process, the electrons with higher energy state tunnels out of the storing material 105. After the time interval $T_1$, both the negative voltage bias to the control gate 104 and the positive voltage bias to the well electrode 112 are switched to zero for a delay time $T_D$.

Following the delay time $T_D$, the well voltage bias is switched to a third positive voltage $V_3$ such that the electrical field generated by the voltage difference $V_3$ between two electrodes is insufficient to cause F/N tunneling between the storing material 105 and device substrate 103. Meanwhile, the application of voltage bias $V_3$ to the well de-populates the electrons in the traps near the channel interface. The trap depopulation process is fast and continues for the time intervals $T_2$ less than microseconds. During the third time interval $T_3$ of about hundreds of microseconds, the voltage bias to the well electrode 112 is switched to zero and a fourth voltage $V_4$ of negative polarity is applied to the control gate electrode. During this time interval $T_3$, charges tunnel between the storing material 105 and the interfacial traps. After the applied voltage biases are switched off, the excessive electrons in the taps relax to an equilibrium state. The net charge state in the storing material 105 is changed from an electron-storing state to a hole-storing state.

Figure 5:
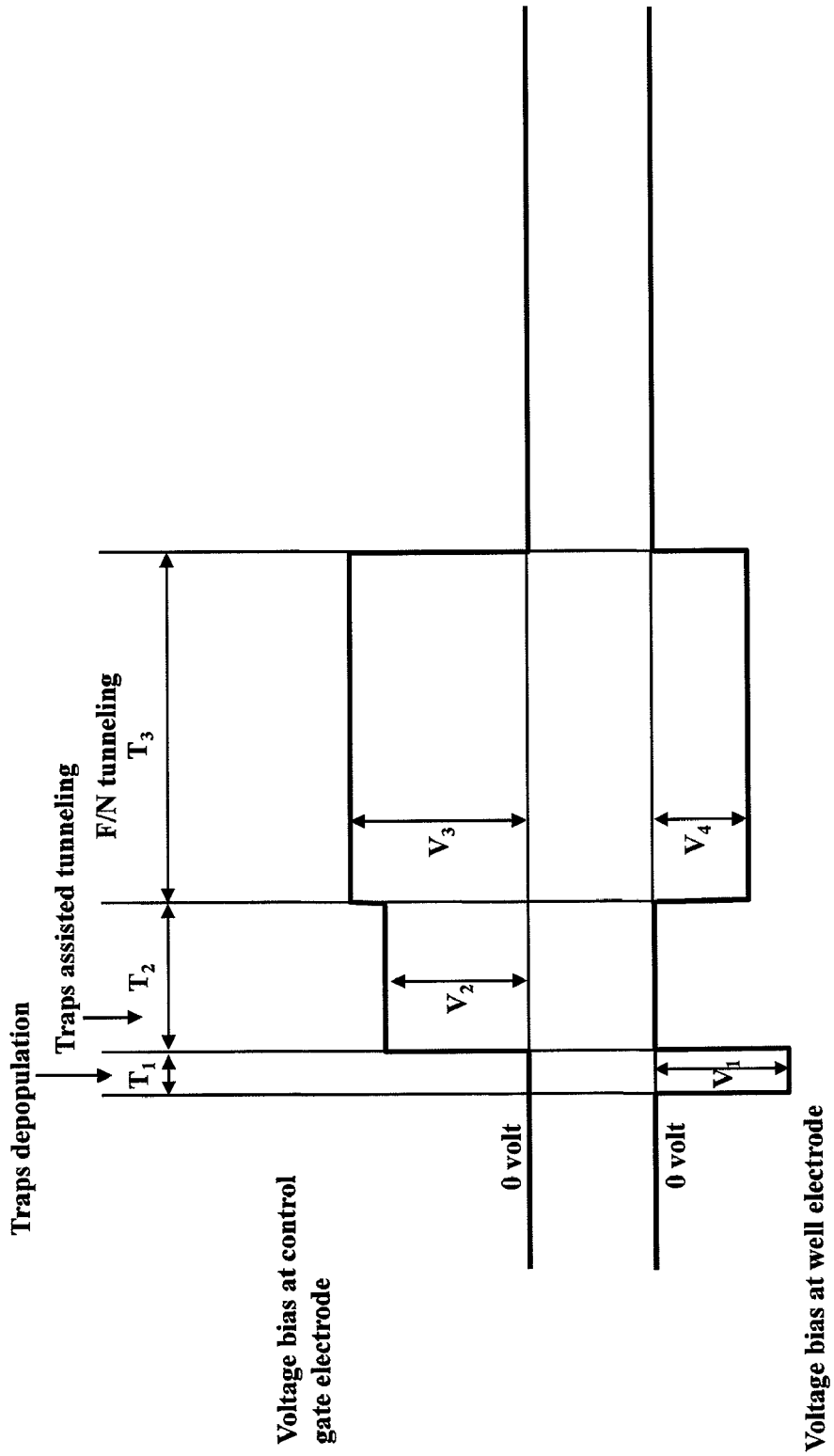
FIG. 5 depicts one embodiment of the invented erase sequence to change the storing material from hole-storing state to electron-storing state for both N-type and P-type non-volatile semiconductor memory cells and their bias voltage waveform timing alignment.

In an embodiment of the present invention where the storing material is changed from a hole-storing state to an electron-storing state, erasing the flash cell for each of the N-type and P-type non-volatile semiconductor devices depicted in FIG. 1 and FIG. 2, respectively, is accomplished by biasing the well electrode and gate electrode as described in FIG. 5.

Figure 6:
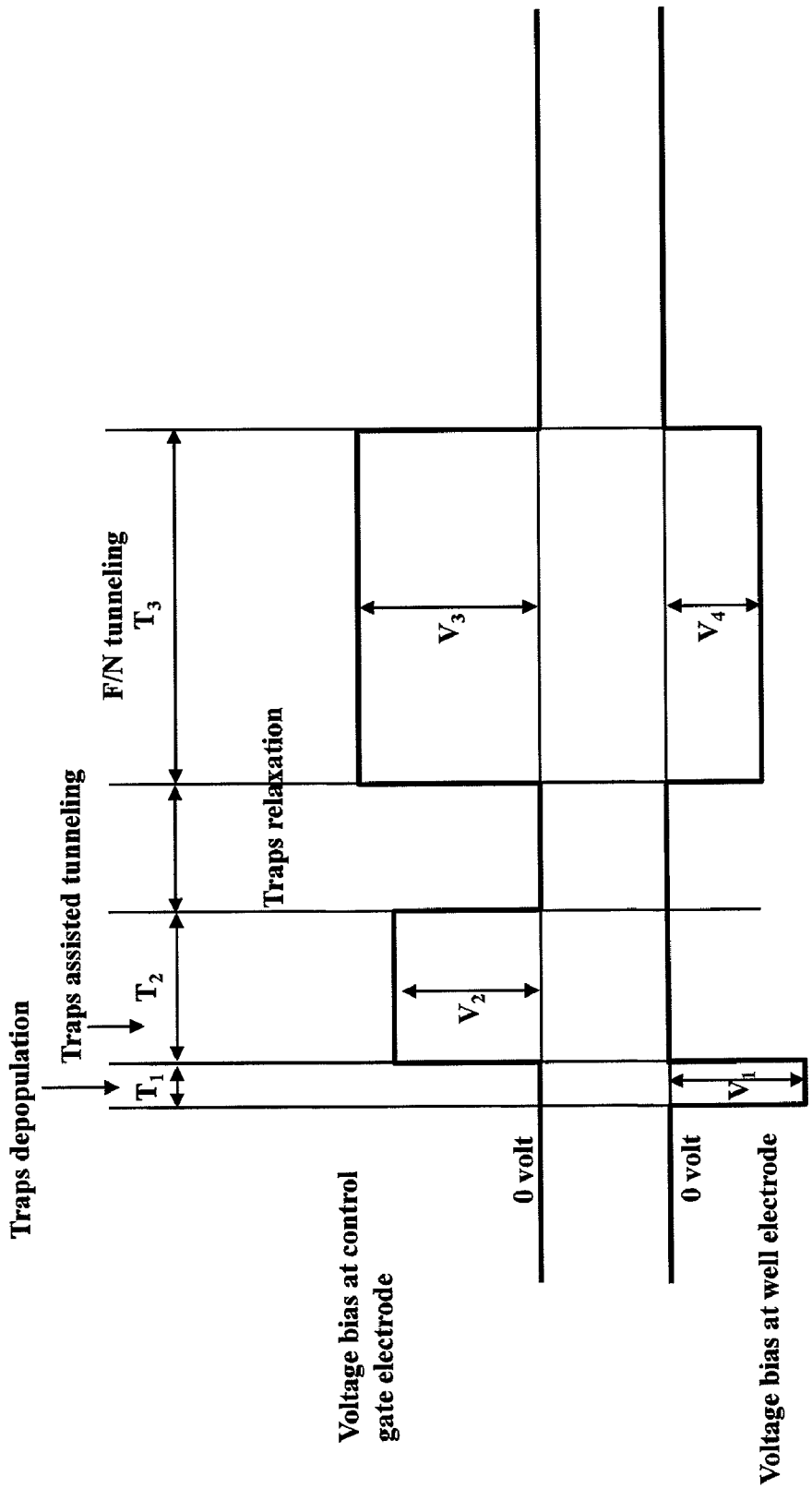
FIG. 6 depicts one embodiment of the invented erase sequence to change the storing material from hole-storing state to electron-storing state for both N-type and P-type non-volatile semiconductor memory cells and their bias voltage waveform timing alignment.

With zero voltage bias applied to the control gate electrode 204, the well electrode 212 is applied with a first negative voltage $V_1$ such that the electrical field generated by the voltage difference $V_1$ is insufficient to cause F/N tunneling between the storing material 205 and device substrate 203. Meanwhile, the application of a voltage bias $V_1$ of negative polarity to the well de-populates holes in the traps near the device channel interface. The trap depopulation process is fast and continues for the time interval $T_1$ less than microseconds. During the second time interval $T_2$ of about hundreds of microseconds, a voltage bias $V_2$ of positive polarity is applied to the control gate electrode 204, while the well voltage bias is switched to zero. In FIGS. 5 and 6, the time interval $T_2$ is defined as a duration of traps assisted tunneling. During the time interval $T_2$, charges tunnel between the storing material 205 and the interfacial traps. The net charge state in the storing material 205 is changed from a hole-storing state to an electron-storing state. It is noted that the well voltage bias shown in FIGS. 5 and 6 is simultaneously applied to the well electrode 212 and the substrate 203 (via the highly doped P-type region 214), whereas each of the source 210 and the drain 208 may be floating or at the same voltage as the well electrode 212.

Following the state change, the control gate voltage bias $V_3$ is of a positive polarity and the well voltage bias $V_4$ is of a negative polarity. The electrical filed strength from the voltage bias difference $(V_3-V_4)$ between the simultaneously applied control gate voltage bias $(V_3)$ and the well voltage bias $(V_4)$ is strong enough to cause the F/N tunneling through the tunneling dielectric for time intervals $T_3$ of milliseconds. The typical applied voltage differences are in the range of tens of volts. During the F/N tunneling process, the electrons tunnel into the storing material 205.

In another embodiment of the present invention where the storing material is changed from a hole-storing state to an electron-storing state, erasing the flash cell for each of the N-type and P-type non-volatile semiconductor devices depicted in FIG. 1 and FIG. 2, respectively, is accomplished by biasing the well electrode and gate electrode as described in FIG. 6. With zero voltage bias applied to the control gate 204, the well electrode 212 is applied with a first negative voltage bias $V_1$ such that the electrical field generated by the voltage difference $V_1$ is insufficient to cause F/N tunneling between the storing material 205 and device substrate 203. Meanwhile, the application of the voltage bias $V_1$ to the well de-populates holes in the traps near the device channel interface. The trap depopulation process is fast and continues for the time intervals $T_1$ less than microseconds. During the second time interval $T_2$ of about hundred microseconds, a second voltage $V_2$ of positive polarity is applied to the control gate 204 while the well voltage bias is switched to zero. During the time interval $T_2$, charges tunnel between the storing material 205 and the interfacial traps. After the applied voltage biases are switched off, the excessive holes in the taps relax to an equilibrium state. The net charge state in the storing material 205 is changed from a hole-storing state to an electron-storing state at the end of the time interval $T_2$.

After the traps relaxation period, a voltage bias $V_3$ of positive polarity and avoltage bias $V_4$ of negative polarity are applied to the control gate 204 and the well electrode 212, respectively, for a time interval $T_3$. The electrical field strength from the voltage bias difference $(V_3-V_4)$ between the simultaneously applied control gate voltage bias $(V_3)$ and the well voltage bias $(V_4)$ is strong enough to cause the F/N tunneling through the tunneling dielectric for the time intervals $T_3$ of milliseconds. The typical applied voltage differences are in the range of tens of volts. During the F/N tunneling process, the electrons tunnel into the storing material 205.

The above operational description is valid for any kind of EEPROM cell by using the same waveforms or reversing their polarity depending on the polarity of charge being manipulated and the type of semiconductor being used to implement the cell. Based on the above, those skilled in the art would realize that the embodiments of the present invention described herein are illustrative only and are not in any way limiting. Other embodiments of this invention will be obvious to those skilled in the art in view of this description.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims.

What is claimed is:

1. A method for erasing a flash electrically erasable, programmable, read-only memory device having a first semiconductor region of one conductivity type formed within a second semiconductor region of an opposite conductivity type, source and drain regions formed from a semiconductor layer of the opposite conductivity type in the first semiconductor region, a well electrode formed from a semiconductor layer of the conductivity type inside the first semiconductor region, a charge storing layer electrically isolated from the first semiconductor region by a dielectric layer and having electric charge retention properties, and a control gate electrode electrically isolated from the charge storing layer by a inter layer of coupling dielectrics, the method comprising the steps of:
   applying a first voltage bias of positive polarity to both the well electrode and the second semiconductor region and a second voltage bias of negative polarity to the control gate electrode for a duration of F/N tunneling;
   after the duration of F/N tunneling, applying a third voltage bias of positive polarity to both the well electrode and the second semiconductor region and a first zero voltage bias to the control gate electrode for a duration of traps depopulation; and
   after the duration of traps depopulation, applying a fourth voltage bias of negative polarity to the control gate electrode and a second zero voltage bias to both the well electrode and the second semiconductor region for a duration of traps assisted tunneling.

2. The method of claim 1, further comprising:
   applying a third zero voltage bias to the control gate electrode, the well electrode and the second semiconductor region for a time period between the step of applying the first voltage bias and the second voltage bias and the step of applying the third voltage bias and the first zero voltage bias.

3. The method of claim 1, wherein each of the source and drain regions is kept floating or at the same voltage as the well electrode.

4. The method of claim 1, wherein the charge storing layer is initially in an electron-storing state.

5. The method of claim 1, wherein the charge storing layer is in a hole-storing state after the step of applying the fourth voltage bias and the second zero voltage bias.

6. A method for erasing a flash electrically erasable, programmable, read-only memory device having a first semiconductor region of one conductivity type formed within a second semiconductor region of an opposite conductivity type, source and drain regions formed from a semiconductor layer of the opposite conductivity type in the first semiconductor region, a well electrode formed from a semiconductor layer of the conductivity type inside the first semiconductor region, a charge storing layer electrically isolated from the first semiconductor region by a dielectric layer and having electric charge retention properties, and a control gate electrode electrically isolated from the charge storing layer by a inter layer of coupling dielectrics, the method comprising the steps of:
   applying a first voltage bias of negative polarity to both the well electrode and the second semiconductor region and applying a first zero voltage bias to the control gate electrode for a duration of traps depopulation;
   after the duration of traps depopulation, applying a second voltage bias of positive polarity to the control gate electrode and a second zero voltage bias to both the well electrode and the second semiconductor region for a duration of traps assisted tunneling; and
   after the duration of traps assisted tunneling, applying a third voltage bias of positive polarity to the control gate electrode and a fourth voltage bias of negative polarity to both the well electrode and the second semiconductor region for a duration of F/N tunneling.

7. The method of claim 6, further comprising:
   applying a third zero voltage bias to the control gate electrode, the well electrode and the second semiconductor region for a time period between the step of applying the second voltage bias and the second zero voltage bias and the step of applying the third voltage bias and the fourth voltage bias.

8. The method of claim 6, wherein each of the source and drain regions is kept floating or at the same voltage as the well electrode.

9. The method of claim 6, wherein the charge storing layer is initially in a hole-storing state.

10. The method of claim 6, wherein the charge storing layer is in an electron-storing state after the step of applying the second voltage bias and the second zero voltage bias.

11. A method for erasing a flash electrically erasable, programmable, read-only memory device having a first semiconductor region of one conductivity type formed within a second semiconductor region of an opposite conductivity type, source and drain regions formed from a semiconductor layer of the opposite conductivity type in the first semiconductor region, a well electrode formed from a semiconductor layer of the conductivity type inside the first semiconductor region, a charge storing layer electrically isolated from the first semiconductor region by a dielectric layer and having electric charge retention properties, and a control gate electrode electrically isolated from the charge storing layer by a inter layer of coupling dielectrics, the method comprising the steps of:

applying a first voltage bias to both the well electrode and the second semiconductor region and a second voltage bias to the control gate electrode for a duration of F/N tunneling;

applying a third voltage bias to both the well electrode and the second semiconductor region and a first zero voltage bias to the control gate electrode for a duration of traps depopulation; and after the duration of traps depopulation, applying a fourth voltage bias to the control gate electrode and a second zero voltage bias to both the well electrode and the second semiconductor region for a duration of traps assisted tunneling.

12. The method of claim 11, wherein each of the source and drain regions is kept floating or at the same voltage as the well electrode.

13. The method of claim 11, wherein a polarity of the first voltage bias is opposite to that of the second voltage bias; and wherein a polarity of the third voltage bias is the same as that of the first voltage bias but opposite to that of the fourth voltage bias.

14. The method of claim 11, wherein when the charge storing layer is initially in an electron-storing state, the step of applying the first voltage bias and the second voltage bias is followed by the step of applying the third voltage bias and the first zero voltage bias.

15. The method of claim 14, further comprising:
applying a third zero voltage bias to the control gate electrode, the well electrode and the second semiconductor region for a time period between the step of applying the first voltage bias and the second voltage bias and the step of applying the third voltage bias and the first zero voltage bias.

16. The method of claim 11, wherein when the charge storing layer is initially in a hole-storing state, the step of applying the fourth voltage bias and the second zero voltage bias is followed by the step of applying the first voltage bias and the second voltage bias.

17. The method of claim 16, further comprising:
applying a third zero voltage bias to the control gate electrode, the well electrode and the second semiconductor region for a time period between the step of applying the fourth voltage bias and the second zero voltage bias and the step of applying the first voltage bias and the second voltage bias.

* * * * *